United States Patent [19]

Fujimura et al.

[11] Patent Number: 4,482,842
[45] Date of Patent: Nov. 13, 1984

[54] CURVED TUBE TYPE ULTRA HIGH PRESSURE MERCURY ARC DISCHARGE LAMP DEVICE

[75] Inventors: Takashi Fujimura; Yoshifumi Tomita, both of Mobara; Kiyoshi Sawatari, Tokyo, all of Japan

[73] Assignee: Hitachi, Ltd., Tokyo, Japan

[21] Appl. No.: 306,714

[22] Filed: Sep. 29, 1981

[30] Foreign Application Priority Data

Oct. 1, 1980 [JP] Japan ................. 55-135886
Oct. 1, 1980 [JP] Japan ................. 55-135888
Oct. 1, 1980 [JP] Japan ................. 55-135890

[51] Int. Cl.³ .................. H01J 61/30; H01J 61/20
[52] U.S. Cl. .................. 313/634; 313/639; 313/165
[58] Field of Search ............ 313/165, 639, 634, 172

[56] References Cited

U.S. PATENT DOCUMENTS

| 760,789 | 5/1904 | Hewitt | 313/165 X |
| 965,900 | 8/1910 | Hewitt | 313/165 X |
| 2,190,657 | 2/1940 | Germer | 313/165 X |
| 2,467,687 | 4/1949 | Noel | 313/639 X |
| 3,878,419 | 4/1975 | Lafiandra | 313/634 X |

FOREIGN PATENT DOCUMENTS

| 0107871 | 6/1939 | Australia | 313/634 |
| 2410123 | 9/1974 | Fed. Rep. of Germany | 313/634 |
| 0163670 | 4/1980 | Netherlands | 313/634 |

*Primary Examiner*—Palmer Demeo
*Attorney, Agent, or Firm*—Charles E. Pfund

[57] ABSTRACT

In a curved tube type ultra high pressure mercury discharge lamp device of the type comprising an arcuate glass tube, a quantity of mercury contained in both ends of the glass tube and electrodes projecting into the glass tube beyond surfaces of the mercury for creating electric discharge between the electrodes, throttles are formed on an inner surface of the glass tube near the electrodes. The throttles have diameters smaller than an inner diameter of the glass tube and the mercury is contained in spaces between the throttles and the both ends of the glass tube.

10 Claims, 19 Drawing Figures

FIG.3
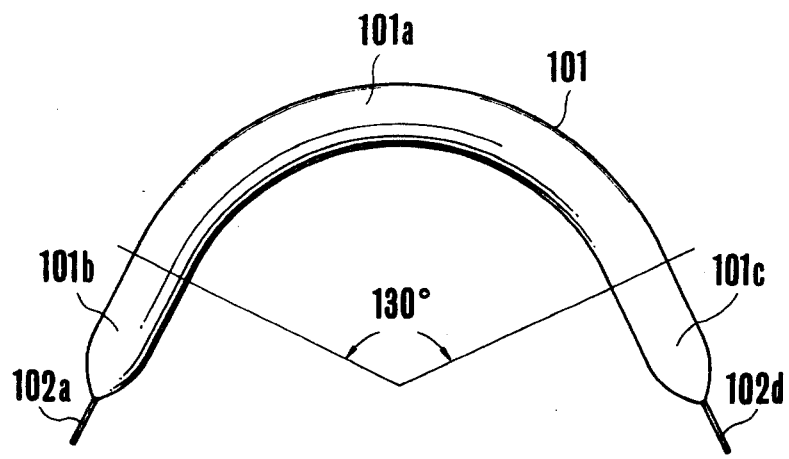
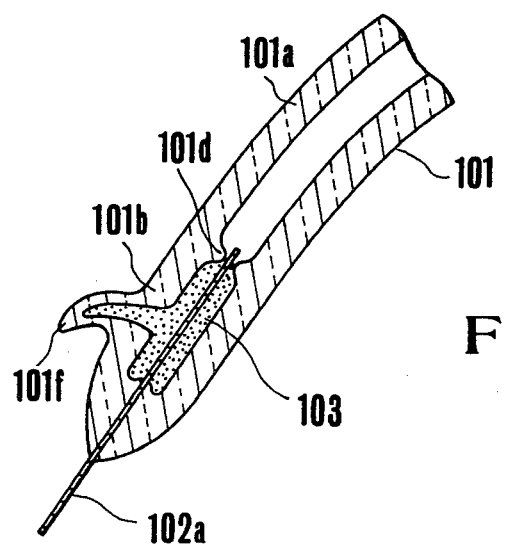
FIG.4

CURVED TUBE TYPE ULTRA HIGH PRESSURE MERCURY ARC DISCHARGE LAMP DEVICE

BACKGROUND OF THE INVENTION

This invention relates to a curved tube type ultra high pressure mercury arc discharge lamp device.

A curved tube type ultra high pressure mercury arc discharge device is often used to form such fine pattern as an IC pattern, for example, on a semiconductor wafer with photolithographic technique for the purpose of minimizing the effect of interference or diffraction of light.

Such curved tube type mercury arc discharge lamp comprises a curved transparent glass tube in which a quantity of mercury is sealed, and tungsten electrodes sealed at both ends of the tube, and a voltage is impressed across the electrodes to emit light through a curved portion at the center of the tube. With this construction, however, it is difficult to seal in the tube a predetermined quantity of mercury. The stability of the current flowing through the tube is determined by the length of the electrodes projecting beyond the surfaces of the mercury, and the life of the tube is also determined by that length. Accordingly, it is necessary to adjust the quantity of the mercury sealed in the tube in accordance with the length of the electrodes projecting into the tube through the surfaces of the mercury. Such adjustment is usually done by adjusting the length of the seals but in a prior art construction such adjustment requires a considerably high degree of skill and is a difficult job. Moreover, in the prior art discharge lamp device, as the stems and electrodes are electrically connected together when the tube is cooled with water, high potential portions are exposed in water to decrease insulating strength.

Further, in a prior art discharge lamp holding device since the stems are electrically connectd to the electrodes and since the stems are soldered to a terminal board secured on a locator so as to mount the discharge lamp on the locator it has been necessary to make the locator of an insulating material. Moreover, as the electrode supports become high temperature, it is necessary to form them with such materials having high temperature resistant property and high electric insulating strength as ceramic or glass filled with a powder of mica.

Such locator is not only expensive but also lacks dimensional accuracy because it is a fired product, thus makes it difficult to set the light source at a correct position. Further such ceramic locator has poor mechanical strength.

SUMMARY OF THE INVENTION

Accordingly, it is a principal object of this invention to provide an improved discharge lamp device including a high pressure discharge lamp capable of stabilizing the tube current.

Another object of this invention is to provide a discharge lamp device including a high pressure lamp capable of supplying a stable tube current over a long time period.

Still another object of this invention is to provide a discharge lamp device having a discharge lamp holding structure in which a locator that holds the discharge lamp can be worked at a high accuracy thereby correctly setting the position of the light source of the discharge lamp.

Yet another object of this invention is to provide a discharge lamp device including a discharge lamp holding structure having sufficiently high mechanical strength so that it is less liable to be ruptured.

A further object of this invention is to provide a discharge lamp device including a discharge lamp holding structure having a simple construction and one which can reduce the cost of manufacturing.

Still further object of this invention is to provide a discharge lamp device including a discharge lamp holding structure that does not decrease its insulating strength.

According to this invention, there is provided a curved type ultra high pressure mercury discharge lamp device of the type comprising an arcuate glass tube, a quantity of mercury contained in both ends of the glass tube, and electrodes projecting into the glass tube beyond surfaces of the mercury for creating electric discharge between the electrodes, wherein throttles are formed on an inner wall of the glass tube near the electrodes, the throttles having inner diameters smaller than an inner diameter of the glass tube and the mercury being contained in spaces between the throttles and both ends of the glass tube.

BRIEF DESCRIPTION OF THE DRAWINGS

In the accompanying drawings:

FIG. 3 is a front view showing one embodiment of the ultra high pressure mercury discharge lamp shown in FIG. 1;

FIG. 4 is a sectional view showing one end of the discharge lamp shown in FIG. 3;

DESCRIPTION OF THE PREFERRED EMBODIMENTS

Figure 1:
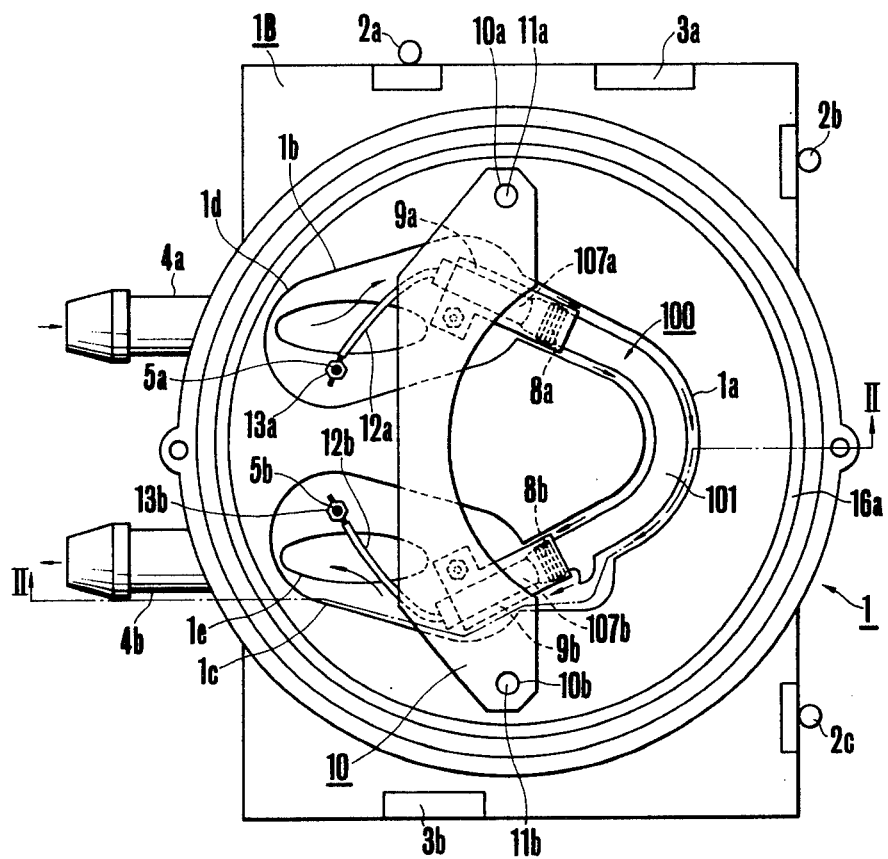
FIG. 1 is sectional plan view showing one embodiment of the discharge lamp device according to this invention.
Figure 2:
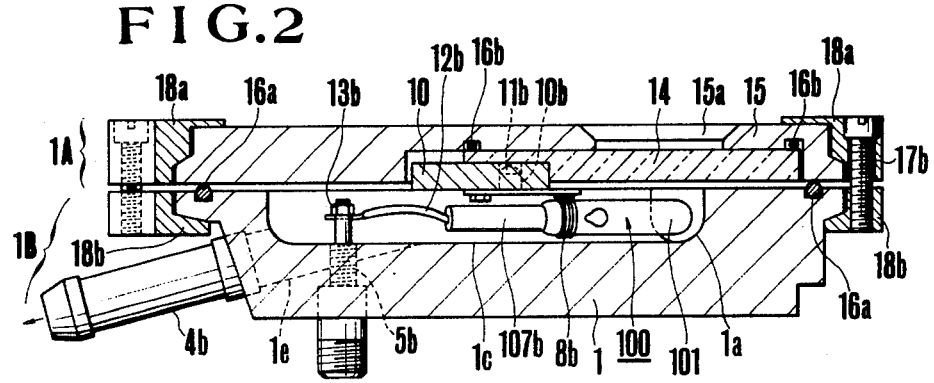
FIG. 2 is a sectional view taken along a line II—II shown in FIG. 1.

Referring now to FIGS. 1 and 2, a lamp house 1 is made up of an upper half 1A and a lower half 1B, and their positions are determined by guide pins 2a, 2b and 2c. The lamp house 1 is set on a support of a light exposure device, not shown, by clamping members 3a and 3b. The lower half 1B of the lamp house 1 is formed with an arcuate recess 1a adapted to receive a lamp 100, electrode receiving recesses 1b and 1c at both ends of the lamp receiving recess 1a, and inclined inlet and outlet passages 1d and 1c extending downwardly from the electrode receiving recesses 1b and 1c respectively. Cooling water inlet and discharge pipes 4a and 4b are connected to the outer ends of the inlet and outlet passages 1d and 1e. Electric current supply terminals 5a and 5b are threaded into the lower half 1B from under with their inner ends projected into the electrode receiving recesses 1b and 1c respectively. These electric current supply terminals 5a and 5b are fixed by an epoxy resin for assuring air tightness. The ultra high pressure discharge tube 100 having an arcuate discharge portion comprises a glass tube 101 and stems 107a and 107b secured to the opposite ends of the tube 101. Coil springs 8a and 8b are wrapped about nonluminous portions at both ends of the glass tube 101. The coil springs 8a and 8b are soldered to mounting plates 9a and 9b secured to a locator 10. The locator 10 is provided with pin holes 10a and 10b at both ends thereof. Guide pins 11a and 11b secured to the upper surface of the upper half 1A of the lamp house 1 are fitted into the pin holes 10a and 10b for mounting the locator 10 at the correct position of the lamp house 1. Then, the discharge lamp 100 is received in the lamp receiving recess 1a, and electrode receiving recesses 1b and 1c. One end of each lead wire 12a and 12b is respectively connected to the electrodes inside of the stems 107a and 107b of the discharge lamp 100, while the other ends are secured to the electric current supply terminals 5a and 5b with screws 13a and 13b.

A face plate 14 and lid 15 having an opening 15a above the face plate 14 are mounted on the upper half 1A of the lamp house 1. The lid 15 is urged against the lamp house 1 through O rings 16a and 16b by clamping together with screws 17a and 17b, a flange 18a formed about the periphery of the lid 15 and a flange 18b formed about the periphery of the lower half 13. Accordingly, the lamp receiving recess 1a, and the electrode receiving recesses 1b and 1c are maintained in an air tight condition.

When cooling water is introduced through the inlet tube 4a, the cooling water flows through the inlet passage 1d, the electrode receiving recess 1b, the lamp receiving recess 1a, the electrode receiving recess 1c, the outlet passage 1e and the discharge tube 4b as shown by arrows, thus cooling the discharge tube 100. When the current supply terminals are connected across a source of power, not shown, the central portion of the glass tube 101 emits light which is radiated through the face plate 14 and the opening 15a.

The elements provided for the discharge lamp device described above according to this invention will be described hereunder. According to this invention, the discharge lamp device is provided with means for stabilizing the tube current. More particularly, as shown in FIG. 3, the discharge portion 101a of a glass tube 101 made of quartz is formed as a circular arc over an angle of approximately 130°, and straight electrode portions 101b and 101c are connected to the opposite ends of the arcuate portion. (As used in the specification and claims "glass" is to be understood as being quartz or other UV transparent material). One of the electrode portions 101b will be described in detail with reference to FIG. 4. A cold cathode electrode 102a made of tungsten is sealed in the electrode portion 101b. At the predetermined portion of the inner wall of the electrode portion 101b is formed a throttle 101d having a small diameter. A quantity of mercury 103 is contained in a space between the throttle 101d and the end of the glass tube 101. One end of the electrode 102a projects through the upper surface of the mercury 103 a predetermined length (about 0.7 to 1.0 mm) into the tube at the throttle 101d, and the other end of the electrode 102a projects outwardly through the end of the glass tube 101. A sealed off branch 101f is provided for the purpose of adjusting the level of the mercury with respect to the position of the throttle 101d when the mercury is sealed in the glass tube 101.

Where an electric field having a potential gradient of the order of from 20V/mm to 100V/mm is created in an arcuate space between electrodes 102a and 102b by connecting these electrodes across a source of supply, not shown, through lead wires 12a, 12b and terminals 5a and 5b, the temperature in the glass tube would rise to 800° C., and the pressure therein to 120 atmospheric pressures by the vapor of mercury thus resulting in a plasma arc discharge. When the potential gradient is less than 20V/mm, it is impossible to sustain the discharge, whereas when the potential gradient is higher than 100V/mm, the discharge lamp might be broken. For this reason, the value of the potential gradient is selected to be in a range described above.

According to this invention, since the throttle 101d is provided it is possible to determine the quantity of the mercury to a correct value. Moreover, since under a non-operative state, the electrodes 102a and 102b project beyond the upper surfaces of the mercury a predetermined length (about 0.7 to 1.0 mm), the emission of electrons during discharge can be stabilized.

Figure 5:
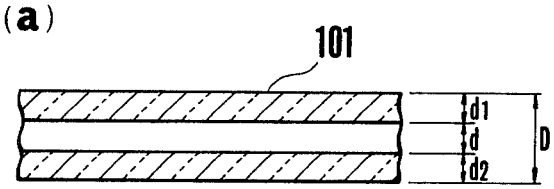
FIGS. 5a through 5d are sectional views showing successive steps of manufacturing the discharge lamp shown in FIG. 3.
Figure 5:
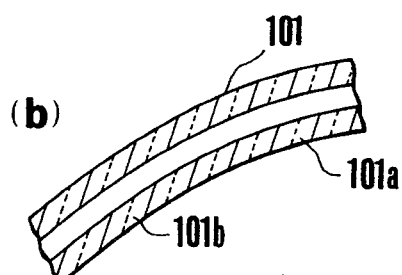
Figure 5:
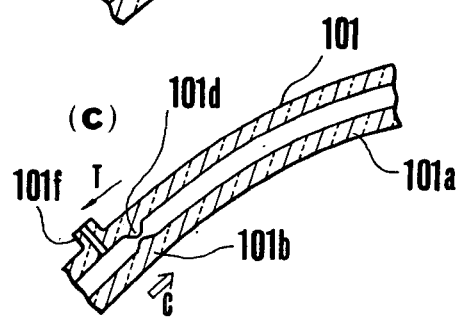
Figure 5:
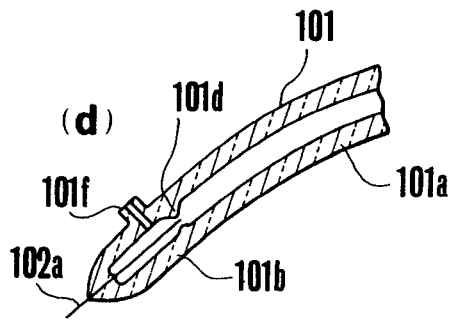

A method of manufacturing a ultra high pressure discharge lamp of the type described above will now be described with reference to FIGS. 5a through 5d. In the step shown in FIG. 5a, a quartz glass tube 101 having an outer diameter D and an inner diameter d is prepared. The ratio between the outer and inner diameters is selected to satisfy a relation $2 \leq D/d \leq 5$, and the outer and inner diameters are made to be slightly eccentric such that $d1 > d2$. The glass tube 101 is prepared by polishing its outer surface, washing its inner and outer surfaces and then heat treating. Then, the glass tube 101 is heat bent with its thicker wall portion located outside. When the tube becomes wavy as a result of the bending step, the wavy configuration is corrected. FIG. 5b shows this state.

Since the constructions of the electrode portions 101a and 101b are the same only the electrode portion 101b will be described. Thus, after heating the terminal portion 101b, it is pulled with a small force in a direction shown by arrow T and then strongly pressed in the direction of arrow C to form a nozzle 101d. Then the seal off tip 101f is formed between the throttle 101d and the end of the tube 101. After working, annealing and removing impurities from the end of the glass tube 101, an electrode 102a is sealed in that end. FIG. 5d shows this state. Then, the interior of the glass tube 101 is evacuated and then a quantity of mercury is introduced into the glass tube through the seal off tip 101f and the mercury is equally divided to both ends. The level of the mercury is adjusted by expanding or contracting the seal off tip 101f to adjust the exposed length of the electrode to the throttle 101d. Thereafter the seal off tip is completely sealed.

During operation of the ultra high pressure discharge lamp described above, the tips of the electrodes exposed in the glass tube gradually wear out with the result that the number of thermal electrons emitted would decrease due to cooling effect of the mercury. This decreases the tube current. As the electrodes wear, the metal thereof would deposit on the nearby tube wall causing surface discharge, which in turn causes distortion of the arc. The distortion of the arc causes electrons to collide upon the glass wall and the electrode metal deposited thereon, thus corroding the glass tube. Such phenomenon begins to appear after the lamp has been operated for 100 to 200 hours. Due to the arc distortion and corrosion, the path of the arc varies and the tube current gradually decreases while varying greatly. When the wear of the electrodes increases to a certain extent, decrease in the tube current ceases, thus decreasing degradation of the tube near the electrodes.

Figure 6:
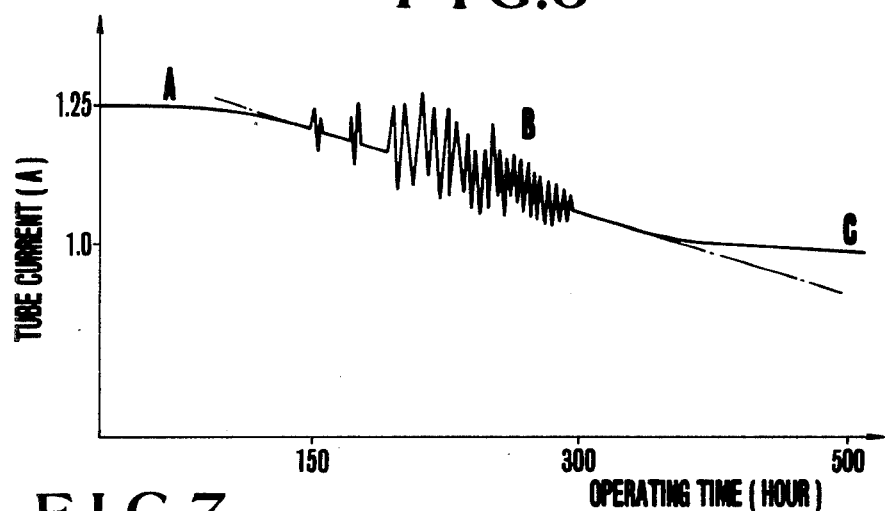
FIG. 6 is a graph showing the relationship between the lighting time and lamp current.

FIG. 6 is a graph showing the relationship between the operating time and the tube current, in which A represents a region wherein the tube current begins to decrease due to the wear of the electrodes, B a region in which the tube current varies greatly due to arc variation, and C a region in which the tube current decrease stops as a result of deposition, that is decrease in the light transmission.

Figure 7:
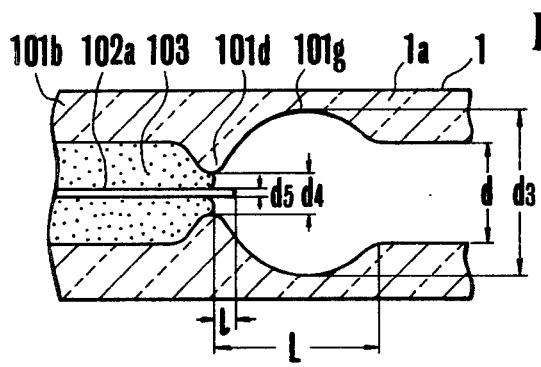
FIG. 7 is a longitudinal sectional view showing one end of a modified discharge lamp.

Another example that can prevent decrease in light transmission will be described with reference to FIG. 7 in which portions corresponding to those shown in FIG. 4 are designated by the same reference characters. A spherical recess $101g$ is formed contiguous to the throttle $101d$. Denoting the length of the spherical recess $101g$ by L, and its diameter by d3, satisfactory results were obtained when relations $d3 < L < 2d$ and $1.2d < d3 \leq 1.5d$ were satisfied. Advantageously, the spherical recess $101g$ should be contiguous to the throttle $101d$.

Denoting the inner diamter of the throttle $101d$ by d4, and the diameter of the electrode $102a$ by d5, satisfactory results were obtained when a relation $2d5 < d4 < 3d5$ was satisfied. The length l of the electrode 102 during the non-operative state is designed to be 0.7 mm but during the operation it becomes to satisfy a relation $1.0 mm < l < 1.2 mm$.

Since the ultra high pressure discharge lamp 100 of this invention is provided with a recess $101g$ about the projected end of the electrode it is possible to prevent surface discharge caused by the deposition of the electrode metal which decreases fluctuation of the electric arc, thus preventing decrease in the tube current. Consequently, the lamp can operate stably over a long time.

Figure 8:
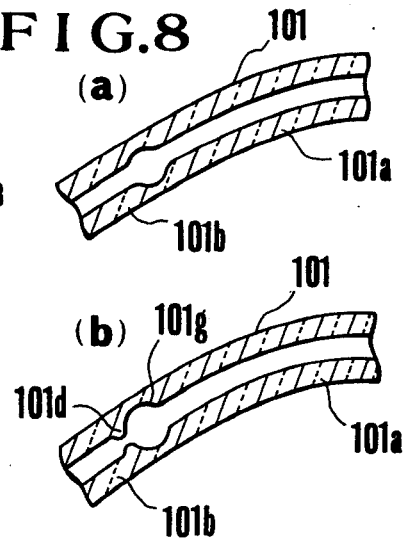
FIGS. 8a and 8b are partial longitudinal sectional views showing certain steps of manufacturing the discharge lamp shown in FIG. 7.

To manufacture this ultra high pressure discharge lamp, subsequent to the steps shown in FIGS. 5a and 5b, a portion of the electrode portion $101b$ shown in FIG. 8a is heated and the heated portion is blown outwardly. Then a throttle $101d$ and a spherical recess $101g$ contiguous thereto are formed as shown in FIG. 8c by a squeezing step similar to that shown in FIG. 5c. Then electrodes $102a$ and $102b$ are sealed in the same manner as in FIG. 5d.

Figure 9:
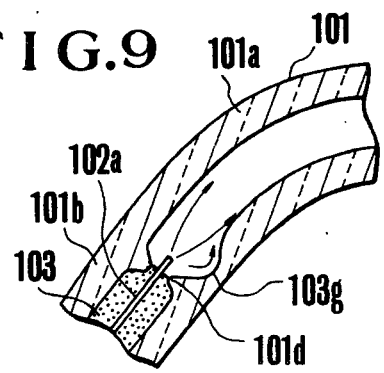
FIG. 9 is a longitudinal sectional view showing a portion of another embodiment of the discharge lamp embodying the invention.

FIG. 9 shows still another embodiment of this invention. When a curved portion or discharge portion $101a$ of the glass tube 101 is formed, since surface discharge occurs along the curved surface having smaller radius of curvature, a spherical recess $101g$ is formed contiguous to the throttle $101d$ only on the surface having smaller radius of curvature.

The holding structure of the discharge lamp 100 will now be described with reference to FIG. 10. Mounting plates $9a$ and $9b$ disposed on the locator 10 are made of a copper plate and take the form of L. The mounting plates $9a$ and $9b$ are secured to the locator 10 by screws $22a$ and $22b$ and nuts $23a$ and $23b$ at symmetrical positions. Coil springs $8a$ and $8b$ made of phosphor bronz are wrapped about the nonluminous portions of the glass tube 101, that is the electrode portions $101a$ and $101b$. These coil springs $8a$ and $8b$ are firmly secured on the glass tube 101 by their resiliency. These coil springs $8a$ and $8b$ are secured to the tips of the mounting plates $9a$ and $9b$ by solder 25, thus mounting the discharge tube on the locator 10 at the correct position. When the solder 25 is applied onto the entire peripheries of the coil springs $8a$ and $8b$ and then when the coil springs $8a$ and $8b$ are soldered to the mounting plates $9a$ and $9b$, more accurate connection between the coil springs $8a$, $8b$ and the mounting plates $9a$, $9b$ can be formed.

With this construction, the glass tube 101 of the discharge lamp 100 is firmly held by the coil springs $8a$ and $8b$ and then mounted on the locator 10 through the solder 25 and the mounting plates $9a$ and $9b$ so that the locator 10 merely mechanically supports the discharge lamp and is completely insulated electrically. Accordingly it is possible to make the locator 10 with metal. The solder 25 can be substituted with a bonding agent or such other bonding means as brazing.

Figure 10:
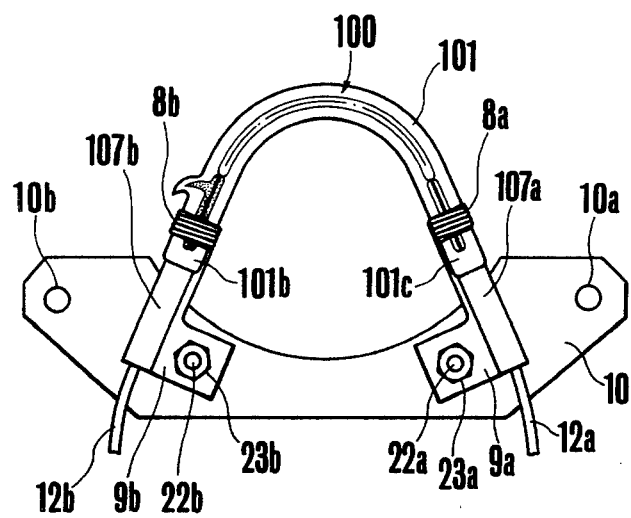
FIG. 10 is a rear side view showing the discharge lamp holding structure shown in FIG. 1.
Figure 11:
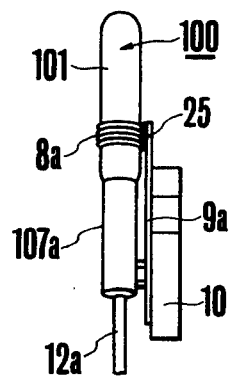
FIG. 11 is a left hand side view of the discharge lamp holding structure shown in FIG. 10.
Figure 12:
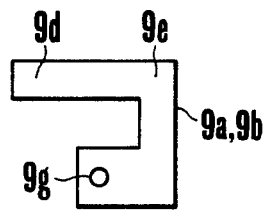
FIG. 12 is a plan view showing a modified mounting plate of the discharge lamp.

FIG. 12 shows a modification of the mounting plates $9a$ or $9b$ shown in FIGS. 10 and 11. In this modified mounting plate, a horizontal strip $9d$ is formed at a portion where one of the coil springs shown in FIGS. 10 is to be soldered. This strip may be wrapped about the nonluminous portion of the glass tube 101 and the end of the strip $9d$ may be soldered or brazed to one leg $9e$ of the mounting plate. The other leg is formed with an opening for securing the mounting plate.

Figure 13:
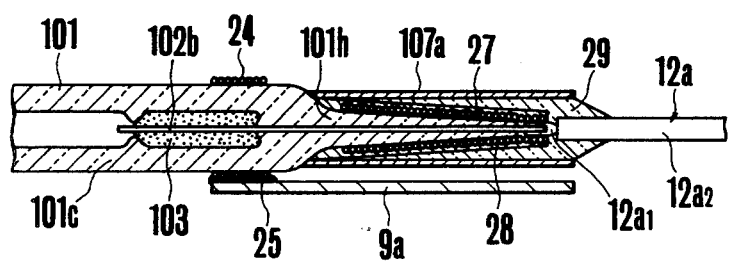
FIGS. 13, 14 and 15 are longitudinal sectional views showing portions near one electrodes of the discharge lamp.

FIG. 13 shows a modified electrode portion $101c$ of the discharge lamp, in which elements corresponding to those shown in the previous embodiment are designated by the same reference characters. The diameter of one end of the glass tube 101 is reduced to form a sealing portion $101b$ and a reinforcing coil spring 27 is wound about the narrow sealing portion $101b$ between the electrode $102b$ and the core $12_{a1}$ of the lead wire $12_a$. An insulation tube 28 made of a silicone rubber is fitted over the coil spring 27 and an epoxy resin coating 29 is applied to cover the insulation coating $12_{a2}$ of the lead wire $12a$ and the insulation tube 28 to provide a tension strength. Since the joint between the electrode $102b$ and the core $12_{a1}$ is reinforced by the coil spring 27 the joint would not be broken even when the lead wire 12 is bent or pulled. The core $12_{a1}$ to be connected with the electrode $102b$ may be precoated with a plated metal film, caulked to the electrode $102b$ and then soldered or brazed together, thus forming a strong joint. Moreover, as the stem $107a$ is completely electrically insulated from the electrode $102b$, even when the stem $107a$ comes into contact with the mounting plate $9a$ there is no fear of resulting in a short circuit fault. Electrode $102a$ is also constructed in the same manner.

In addition to bonding the spring coil 24 to the mounting plate $9a$, the solder 25 may be applied to the entire periphery of the spring coil 24 to increase the bonding force to the glass tube. Instead of using solder, such bonding as an epoxy resin can also be used.

With the discharge tube holding structure, as it is possible to use a locator made of metallic material, it is possible to make the locator with high dimensional accuracies. Moreover, it has a high mechanical strength so that it will not be easily damaged and can be manufactured at a low cost.

Figure 14:
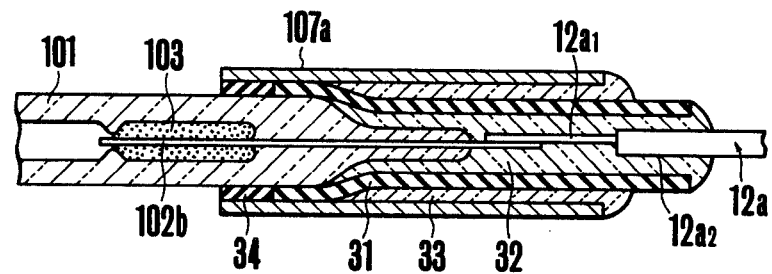

FIG. 14 shows a modification of FIG. 13 and corresponding elements are designated by the same reference characters. In this modification, the tip of the core $12_{a1}$ of a lead wire $12a$ having an insulated coating $12_{a2}$ is welded to one end of an electrode $102b$. A silicone rubber insulating tube 31 having a predetermined length is used to cover the joint between the core $12_{a1}$ and the electrode $102b$. One end of the insulating tube 31 is firmly fitted on the outer surface of the glass tube, while the other end is fitted over the insulating coating $12_{a2}$ of the lead wire $12a$. An epoxy resin 32 is filled in the insulating tube 31 to embed therein the tip of the glass tube 101, one end of the electrode $102b$, the core $12_{a1}$ of the lead wire $12a$, and the end of the insulating 15 coating $12_{a2}$. The epoxy resin is also filled in a space between the stem $107a$ and the insulating tube 31, and a sealing member 34 is fitted between the glass tube 101 and the stem $107a$.

Like the previous embodiment, in this modification too, the stem is electrically insulated from the electrode, and all portions outside of the stem are made of insulating materials so that electroconductive elements connected to the electrode are not exposed. Consequently, even when the discharge lamp is immersed in water, there is no leakage of current.

Figure 15:
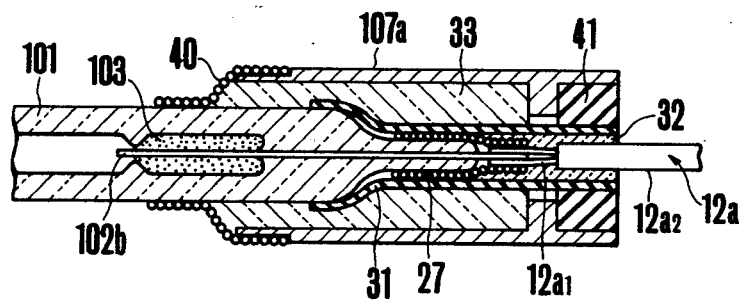

FIG. 15 shows still another embodiment of this invention, in which elements corresponding to those shown in FIGS. 13 and 14 are designated by the same reference characters. In the same manner as in FIG. 13, a reinforcing coil spring 27 is wound about the joint between the electrode $102b$ and the core $12_{a1}$ for preventing application of an external force to the joint when the lead wire $12a$ is pulled or bent. An insulating tube 28 is provided to cover the coil spring 27 and an epoxy resin 28 is contained in the insulating tube 28. Furthermore, an epoxy resin 33 is filled in a space between the stem $7a$, and the insulating tube 28 and the glass tube 101, and the stem $107a$ is connected to the outer surface of the glass tube 101 through a coil spring 40. A space between the inner ends of the stem $107a$ and the insulating tube 28 is filled with a sealing member 41.

With this modification too, as the electric parts connected to the electrode do not expose to the outside, the discharge tube can be immersed in water for the purpose of cooling the same without the fear of causing leakage of electricity.

Where the discharge lamp shown in FIG. 15 is contained in a lamp housing it is possible to prevent the lamp from displacing from a reference position. More particularly, the stem $7a$ of the discharge lamp 100 shown in FIG. 15 is secured to the mounting plate $9a$ in the same manner as in the previous embodiments and the locator is mounted in the lamp housing at a correct position. When the position of the lamp or light source is deviated from a reference position, the position of the glass tube 101 is adjusted with a jig by deforming the coil spring 40 so as to adjust the position of the glass tube 101 with reference to the stem $107a$, thus aligning the light source with the reference position. While maintaining this adjusted position, the coil spring 40 is entirely soldered to set its shape and to secure the coil spring 40 to the stem $107a$. Thereafter, the jig is removed. Even when the both ends of the glass tube 101 are eccentrically secured to the stems $107a$ and $107b$ the eccentricity of the narrow end portions of the tube would vary gradually so that the intermediate portion of the glass tube would be maintained at a correct position.

The coil spring may be secured with a bonding agent. Solder or bonding agent forms a thin film about the coil spring, so that it is possible to strongly bond the coil spring with a small quantity of solder or bonding agent. For this reason, even when a bonding agent is used, the relative position between the glass tube and the stem would not be changed due to shrinkage of the bonding agent. Moreover, as the stems are electrically insulated from the electrodes it is not necessary to use locators made of such expensive material as ceramics. In other words, the locators can be made of low cost metal.

With the discharge lamp holding device described above, it is possible to readily and stably position the light source at a correct position, thereby providing a light exposure device having a high accuracy.

It should be understood that the invention is not limited to the illustrated embodiments and that many changes and modifications will be obvious to one skilled in the art. For example, the discharge lamp described above can be cooled with air instead of water.

What is claimed is:

1. In a curved tube type ultra high pressure mercury discharge lamp device of the type comprising an arcuate glass tube, a quantity of mercury contained in both ends of said glass tube, and electrodes projecting into said glass tube beyond surfaces of said mercury for creating electric discharge between said electrodes, the improvement which comprises throttles formed on an inner surface of said glass tube near said electrodes, said throttles having inner diameters smaller than an inner diameter of said glass tube and said mercury being contained in spaces between said throttles and said both ends of said glass tube and recesses on the internal side of said nozzles, said recesses having larger diameters than the inner diameter of said glass tube wherein an inner diameter d4 of said throttles and a diameter d5 of said electrodes are selected to satisfy the following relation $$2d5 < d4 < 3d5$$

wherein length of said electrodes projecting from the surfaces of said memory is selected to be 0.7 to 1.0 mm when the lamp is not operated.

2. The mercury discharge lamp device according to claim 1 wherein said recesses take the form of a sphere.

3. The mercury discharge lamp device according to claim 1 or 2 wherein said recesses are formed to be contiguous with said throttles.

4. The mercury discharge lamp device according to claim 1 or 2 wherein said recesses are formed only on the inner surface of said glass tube.

5. The mercury discharge lamp device according to claim 1 wherein said electrodes are sealed in both ends of said glass tube, and wherein said mercury discharge lamp further comprises stems at both ends of said glass tube, said stems protecting outwardly projecting portions of said electrodes, a locator made of metal, mounting plates secured on said locator, holding means wound about non-luminous portions of said glass tube, and means for securing said holding means to said mounting plates.

6. The mercury dischage lamp device according to claim 5 wherein said holding means comprise coil springs.

7. The mercury discharge lamp device according to claim 5 wherein said holding means comprise strip members integral with said mounting plates.

8. The mercury discharge lamp device according to claim 5 wherein said holding means comprises solder or braze.

9. The mercury discharge lamp device according to claim 1 wherein said electrodes are sealed in the opposite ends of said glass tube with the other ends of said electrodes protruded to the outside of said glass tube, and said mercury discharge lamp device further comprises insulated lead wires with their cores electrically connected to the protruded ends of said electrodes, insulating tubes surrounding joints between said electrodes and said cores, one end of said insulating tubes being fitted on said glass tube and the other end confronting insulating layers of said lead wires, and insulating materials filled in said insulating tubes.

10. The mercury discharge lamp device according to claim 1 wherein said electrodes are sealed in the opposite ends of said glass tube with the other ends of said electrodes protruded to the outside of said glass tube, and said mercury discharge lamp device further comprises insulated lead wires with their cores electrically connected to the protruded ends of said electrodes, coil springs surrounding joints between said cores and said electrodes and the ends of said glass tube, an insulating tubes surrounding said coil springs, one end of said insulating tubes being fitted on said glass tube and the other end of said insulating tubes confronting insulating layers of said lead wires, and insulating materials filled in said insulating tubes.

* * * * *

UNITED STATES PATENT AND TRADEMARK OFFICE
CERTIFICATE OF CORRECTION

PATENT NO. : 4,482,842
DATED      : November 13, 1984
INVENTOR(S): Takashi Fujimura et al It is certified that error appears in the above—identified patent and that said Letters Patent is hereby corrected as shown below:

Col. 1, l. 39: change "connectd" to --connected--

Col. 2, l. 60: change "electrodes" to --electrode--

Col. 7, l.18: change "insulating 15" to --insulating--

Col. 7, l. 68: change "107b" to --107b,--

Claim 1, col. 8, l. 45: change "2d5<d4<3d5" to --$2d_5 < d4 < 3d_5$--

Claim 1, col. 8, l. 48: change "memory" to --mercury--

Signed and Sealed this

Twenty-sixth Day of November 1985

[SEAL]

Attest:

DONALD J. QUIGG

*Attesting Officer*      *Commissioner of Patents and Trademarks*